(12) United States Patent
Lee

(10) Patent No.: US 7,764,353 B2
(45) Date of Patent: Jul. 27, 2010

(54) TRANSFER SYSTEM

(75) Inventor: Tae Dong Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 1066 days.

(21) Appl. No.: 11/474,371

(22) Filed: Jun. 26, 2006

(65) Prior Publication Data
US 2007/0153153 A1    Jul. 5, 2007

(30) Foreign Application Priority Data
Dec. 29, 2005   (KR) ............. 10-2005-0133507

(51) Int. Cl.
*G02F 1/1333* (2006.01)

(52) U.S. Cl. ............................. 349/158; 349/160

(58) Field of Classification Search ........... 349/158, 349/160
See application file for complete search history.

(56) References Cited

U.S. PATENT DOCUMENTS

2004/0166760 A1* 8/2004 Kikuchi et al. ............. 445/24
2007/0277930 A1* 12/2007 Yokoyama et al. ..... 156/345.31

* cited by examiner

*Primary Examiner*—Mike Qi
(74) *Attorney, Agent, or Firm*—Morgan Lewis & Bockius LLP

(57) ABSTRACT

A transfer system includes first and second shafts arranged in a constant ratio, non-conductive rollers affixed to each of the first shafts for transferring a substrate, and conductive rollers affixed to each of second shafts for transferring the substrate.

20 Claims, 9 Drawing Sheets

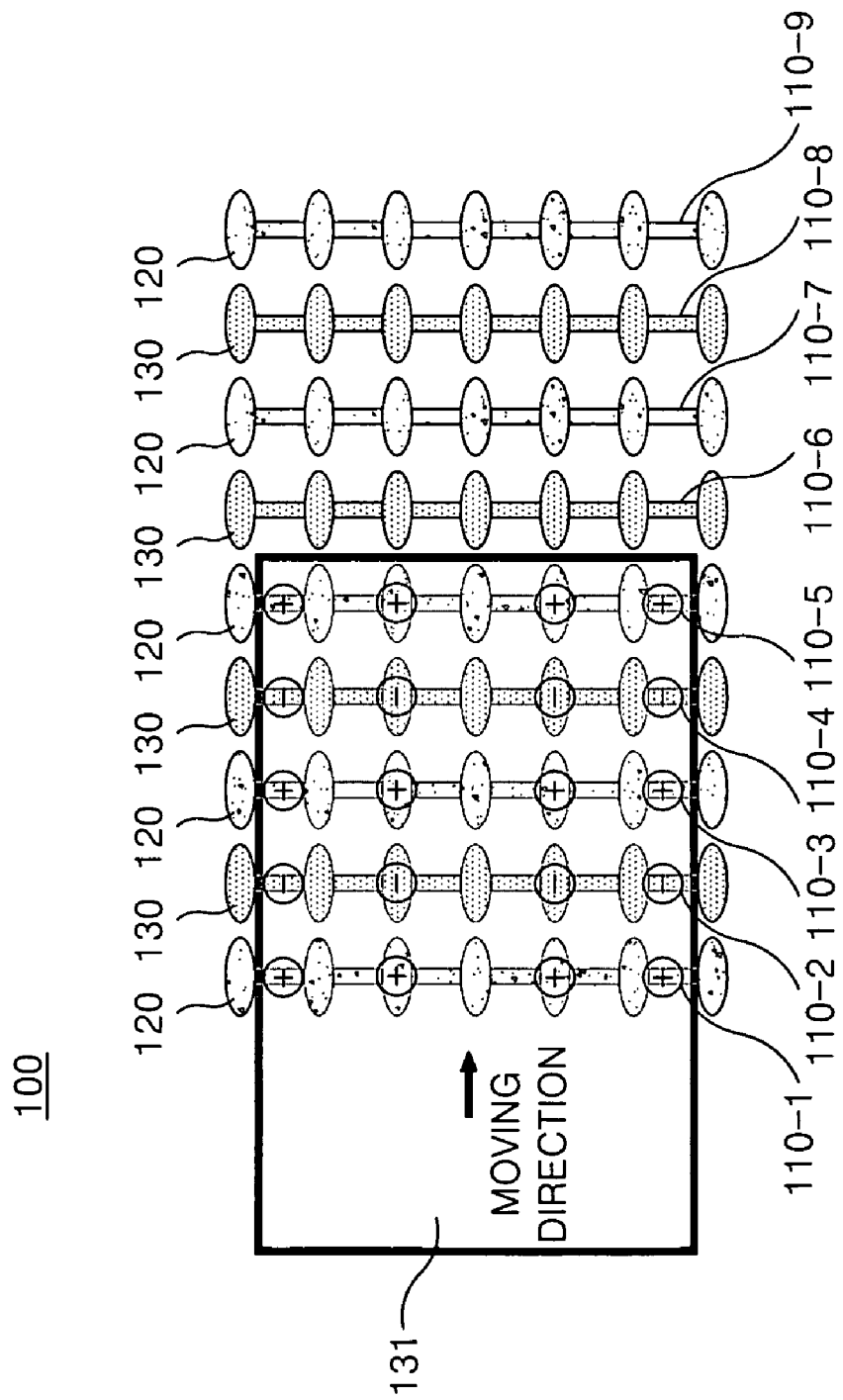

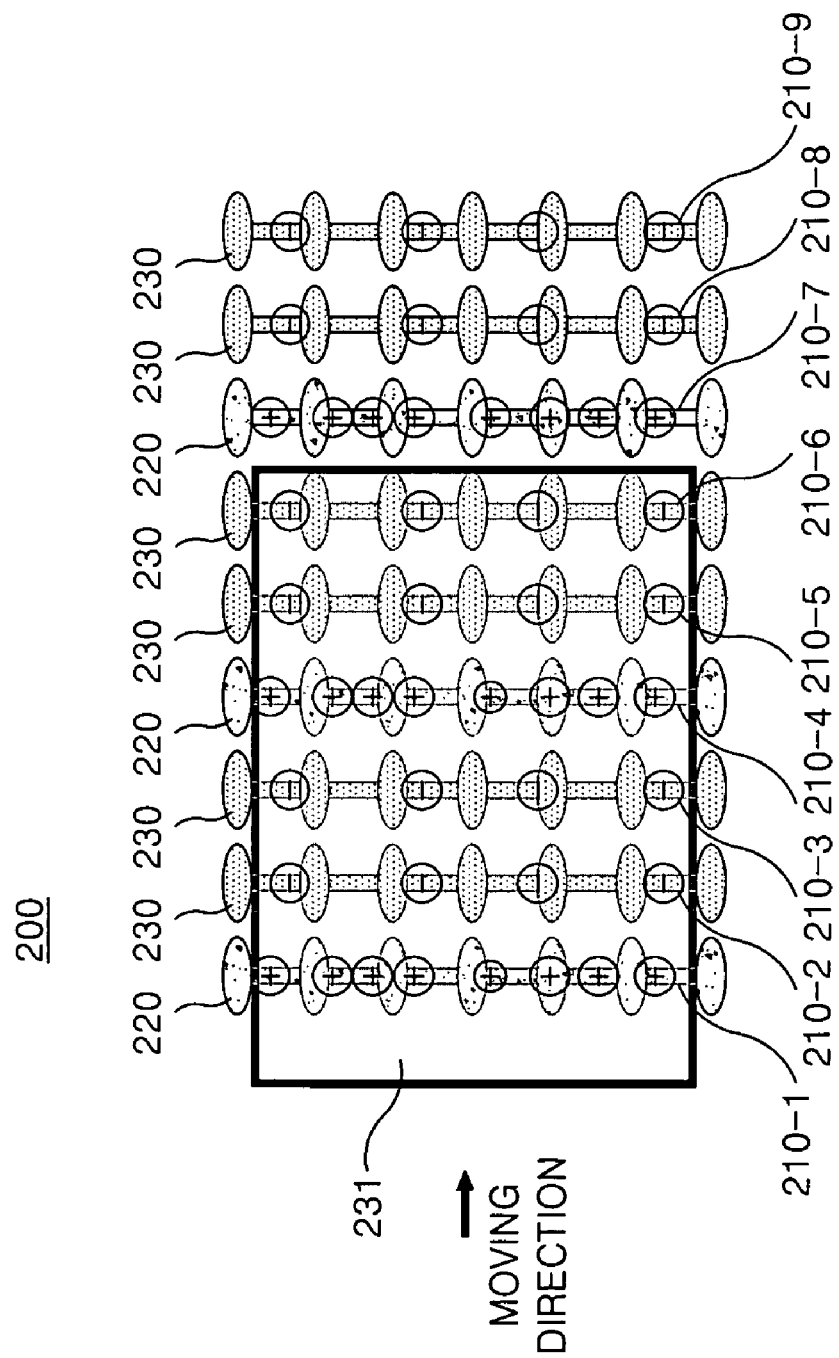

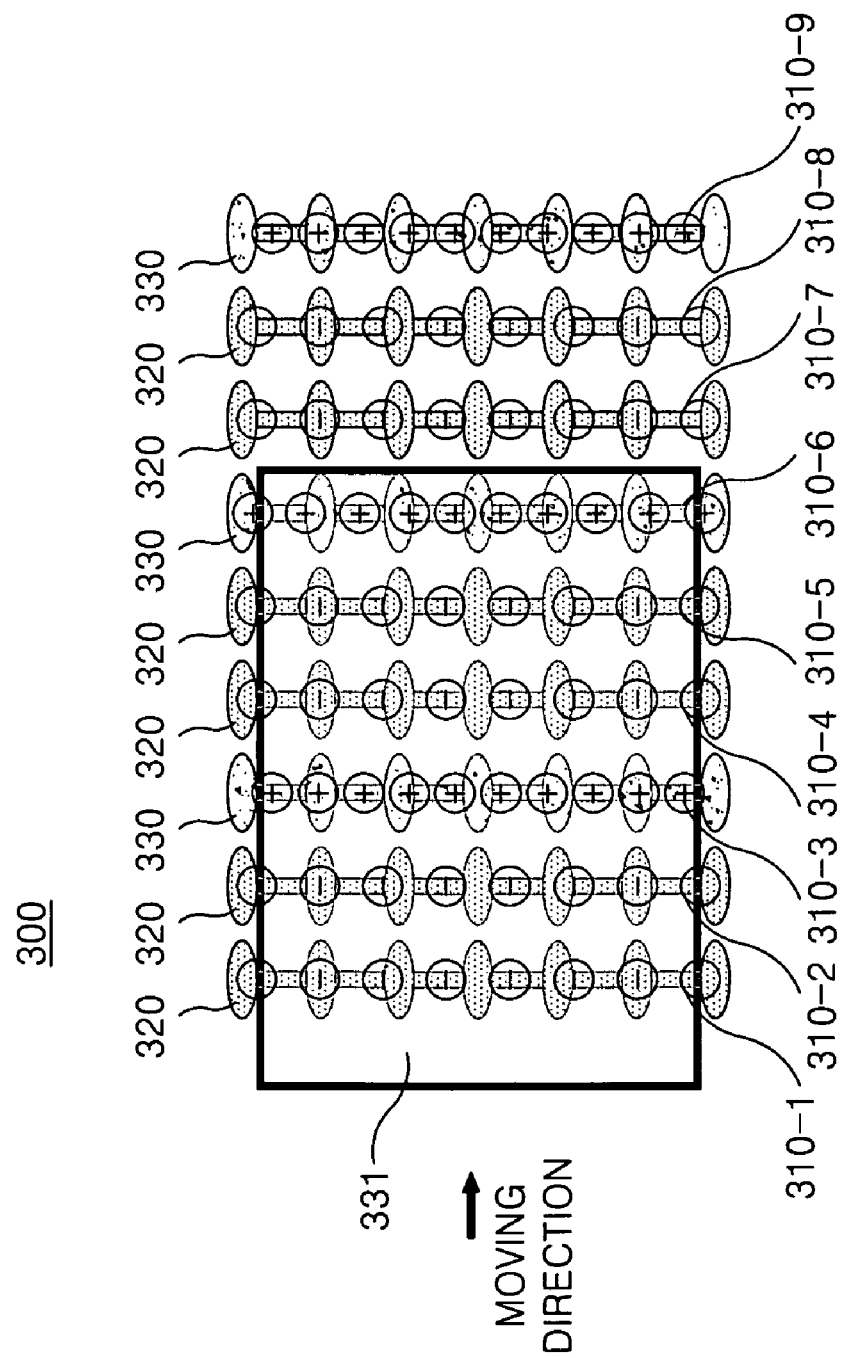

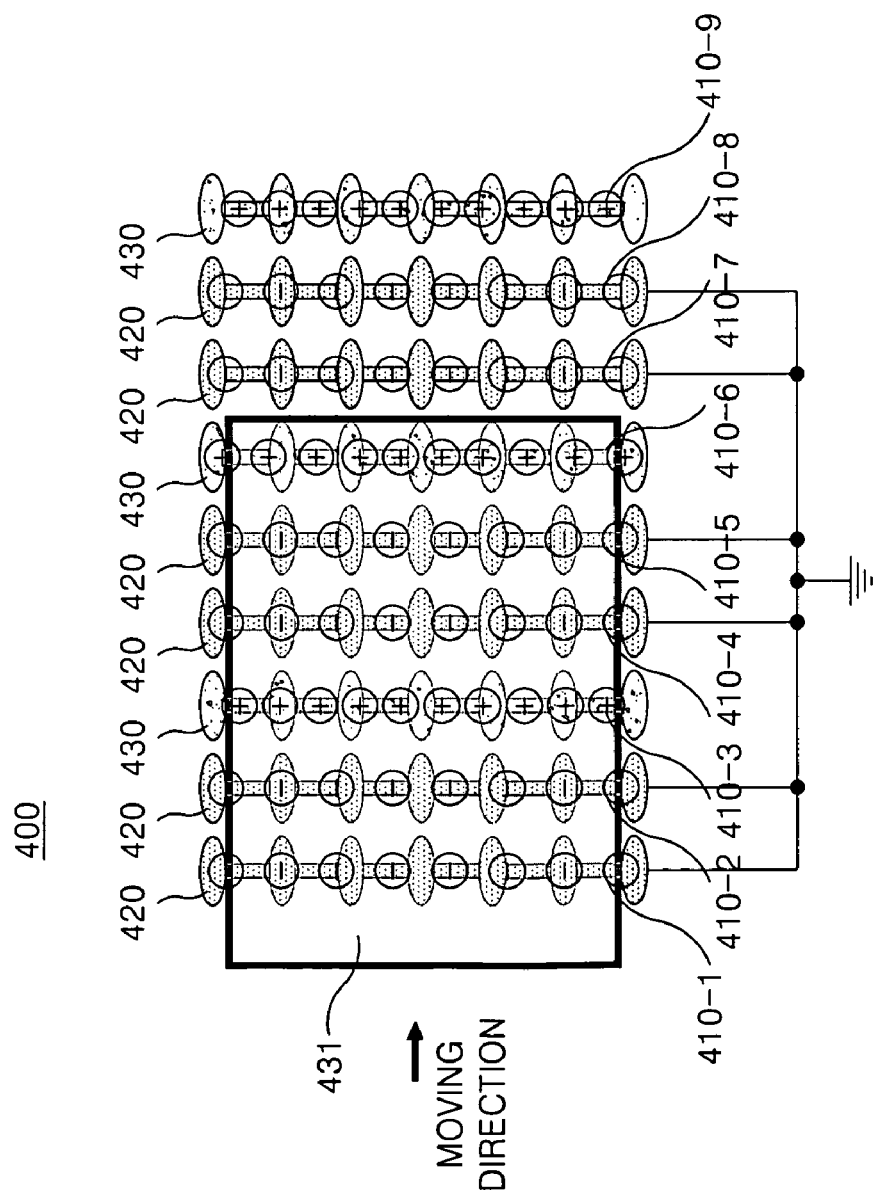

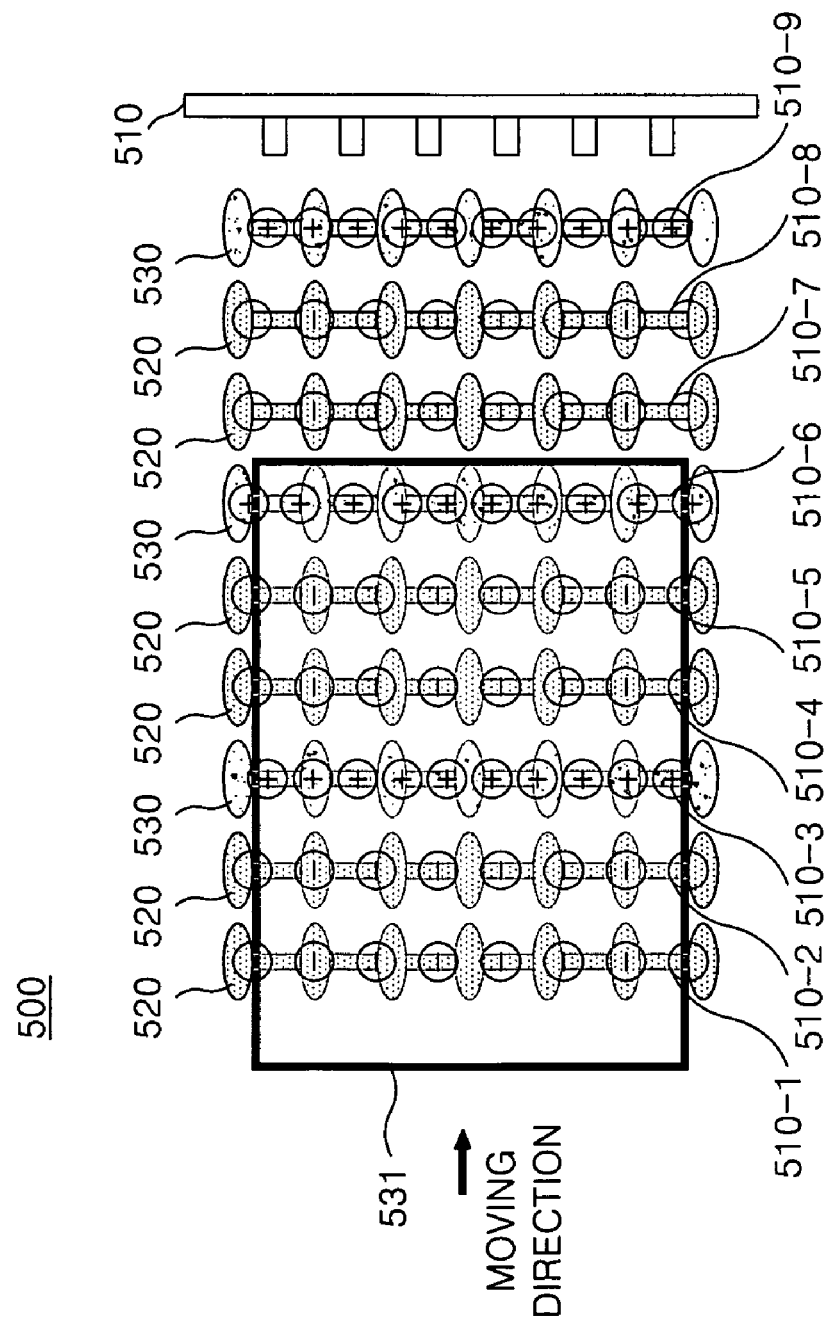

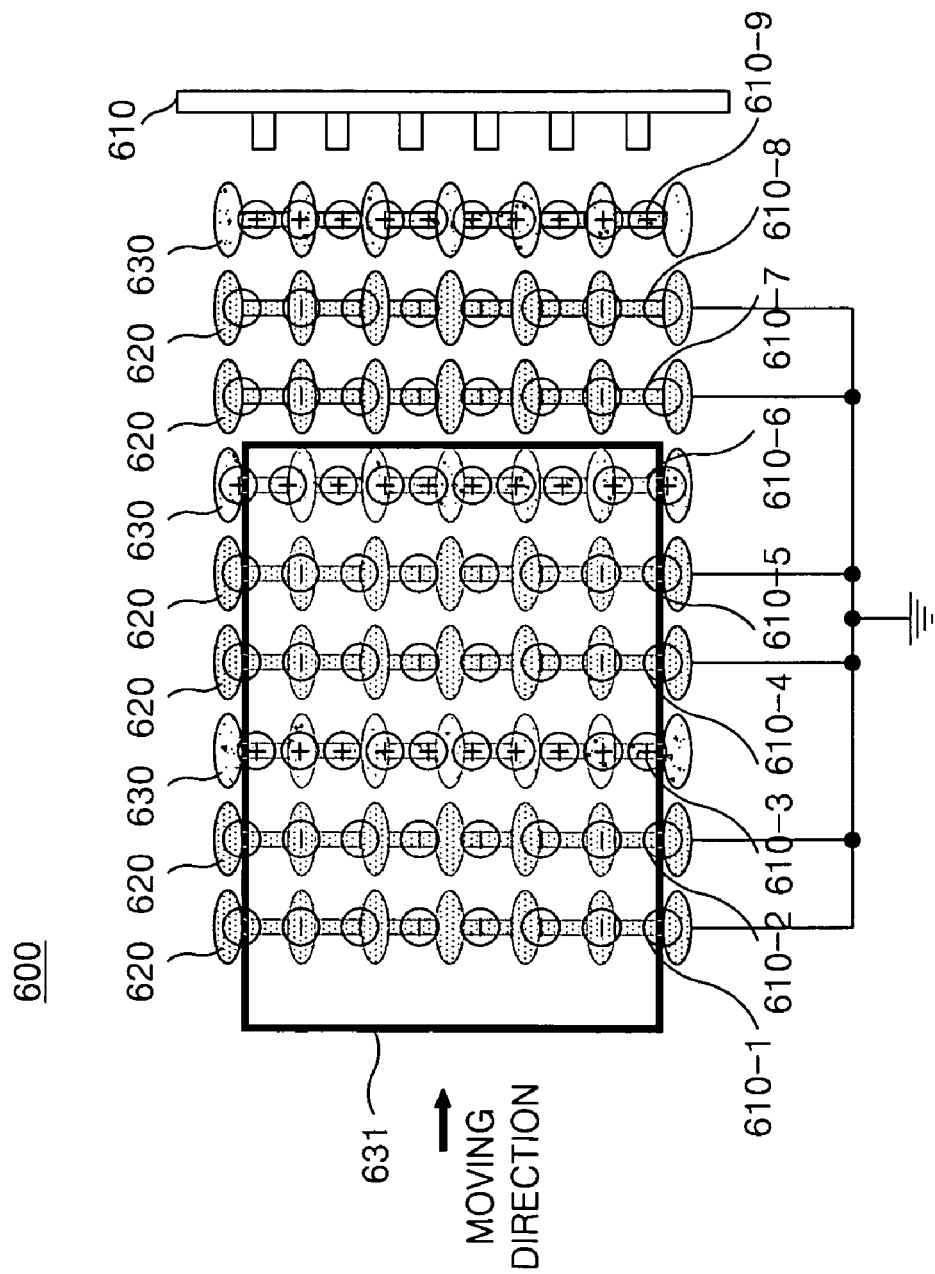

TRANSFER SYSTEM

This application claims the benefit of Korean Patent Application No. P2005-133507 filed in Korea on Dec. 29, 2005, which is hereby incorporated by reference in its entirety.

BACKGROUND OF THE INVENTION

1. Field of the Invention

This invention relates to handling of materials, and more particularly to a transfer system. Although the present invention is suitable for a wide scope of applications, it is particularly suitable for removing static electricity generated by a frictional force in the course of transferring a substrate while fabricating a liquid crystal display device.

2. Description of the Related Art

In general, display devices are very important in conveying visual information in the information society. In the past, a cathode ray tube (CRT) was typically used as the display device. However, the cathode ray tube has the problems of heavy weight and bulky volume. To alleviate these problems of the CRT, flat panel display devices, including liquid crystal display device (LCD), a field emission display (FED), a plasma display panel (PDP) and an electro-luminescence (EL), are introduced into the market.

An LCD device has thin profile and light-weight. Thus, the LCD device has been rapidly replacing the cathode ray tube in many applications. An active matrix type LCD device has a thin film transistor (hereinafter, TFT) for each cell area in a matrix of cell areas. The active matrix type LCD has the advantages of high picture quality and small power consumption.

FIG. 1 is a perspective view showing a liquid crystal display device of an active matrix type according to the related art. Referring to FIG. 1, the liquid crystal display device of the active matrix type includes a color filter array substrate 22 and a TFT array substrate 23, which are affixed to each other with a liquid crystal layer 15 therebetween. The liquid crystal display device shown in FIG. 1 is a portion of the whole display screen.

A black matrix (not shown), a color filter 13 and a common electrode 14 are on a rear side of an upper glass substrate 12 to form a color filter substrate 22. A polarizer 11 is attached on a front side of the upper glass substrate 12. The color filters 13 include red R, green G and blue B color filters to implement a color display.

In the TFT array substrate 23, data lines 19 and gate lines 18 cross each other on a front side of the lower glass substrate 16, and TFTs 20 are formed at the crossings. A pixel electrode 21 is formed at a cell area between the data line 19 and the gate line 18. The TFT 20 switches a data transmitting path between the data line 19 and the pixel electrode 21 in response to a scanning signal from the gate line 18 to drive the pixel electrode 21. A polarizer 17 is attached at the rear side of the TFT array substrate 23.

A liquid crystal layer 15 controls light transmitted through the TFT array substrate 23 by an electric field applied to the liquid crystal layer 15. An alignment film (not shown) is formed on the opposing surfaces of the color filter substrate 22 and the TFT substrate 23 adjacent to the liquid crystal layer 15. The polarizers 11 and 17 attached on the color filter substrate 22 and the TFT substrate 23 allow light polarized in only direction to be transmitted, and the polarizing directions of each of the polarizers 11 and 17 cross each other when the liquid crystal layer 15 is a 90° TN mode.

A method of fabricating a liquid crystal display device of the active matrix type includes substrate cleaning, substrate patterning, alignment forming/rubbing, substrate joining, liquid crystal injecting, packing, inspecting and repairing processes. The substrate cleaning process removes impurities contaminating the substrate surface using a cleaning solution. The substrate patterning process includes a patterning of the color filter array substrate and a patterning of the TFT-array substrate. In the alignment forming/rubbing process, alignment films are respectively coated on the color filter array substrate and the TFT array substrate, and then the alignment films are rubbed by a rubbing cloth. In the substrate joining/a liquid crystal injecting process, the color filter substrate and the TFT array substrate are joined each other by a sealant, and then liquid crystal molecules and spacers are injected through a liquid crystal injection port, which is later sealed. In the packing process of a liquid crystal display panel, a tape carrier package (hereinafter, TCP) is packed with a gate drive integrated circuit and a data drive integrated circuit, and then connected to a pad portion of the substrate. The drive integrated circuit can be directly packed onto the substrate by a Tape Automated Bonding using the above-mentioned TCP or a Chip On Glass (hereinafter, COG) type structure. The inspecting process includes an electrical inspection after a signal wiring, such as a data line and a gate line, and a pixel electrode are formed on the TFT array substrate, followed by another electrical inspection and a naked eye inspection after the substrate joining/the liquid crystal injecting process. The repairing process restores operation of a component on the substrates that the inspecting process indicates to be repairable. On the other hand, a substrate is discarded that the inspecting process indicates as be unrepairable.

In fabrication of most flat panel display device, including the liquid crystal display device, a thin film material disposed on the substrate is patterned by a photolithography process, and the photolithography process consists of a series of photo process, such as coating photo-resist, mask alignment, exposure, development and cleaning. When the photolithography process is completed, the substrate is transferred into another chamber for an etching and stripping process. The transfer system for transferring the substrate from one chamber to another chamber during fabricating of the flat panel display device can include a series of shafts having rollers thereon.

FIG. 2 is a perspective view showing a transfer system using a method of fabricating a related art liquid crystal display device. FIG. 3 is a perspective view showing rollers on a shaft in the transfer system of FIG. 2. As shown in FIG. 2, a transfer system 50 includes a plurality of shafts 51 arranged in such a manner as to have a constant spacing on the same plane and a plurality of rollers 52 on each of the shafts 51 with a constant spacing. The plurality of shafts 51 are supplied with a rotational force so as to rotate the shafts 51 with a constant velocity.

Referring to FIG. 3, a plurality of rollers 52 having a disk shape are affixed to the shaft 51, which passes through a middle portion of the disk shape. The plurality of rollers 52 are fixed on the shaft 51, so that the glass substrate 53 loaded on the transfer system 50 contacts the shaft 51 but directly contacts the rollers 52. Accordingly, if the shaft rotates with a constant velocity, the rollers 52 rotate along with the shaft 51 such that a frictional force between the rollers 52 and the glass substrate 53 is generated to move the glass substrate 130.

Recently, flat panel display devices are becoming very large. Thus, the size of the glass substrate is becoming very large. Accordingly, the shaft 51 length of the transfer system 50 for loading and transferring the large glass substrate is lengthened and more rollers are added to accommodate larger substrates. The frictional force generated between the rollers 52 and the glass substrate 53 can cause a static electricity charged on the glass substrate 53. More rollers generates more of a static electricity charge. Components on the glass substrate 53 can be damaged by such a static electricity charge. Thus, there is need to prevent static electricity so as to protect the components on the glass substrate 53 from damage.

SUMMARY OF THE INVENTION

Accordingly, the present invention is directed to a transfer system that substantially obviates one or more of the problems due to limitations and disadvantages of the related art.

An object of the present invention to provide a transfer system that removes static electricity generated by a frictional force in the course of transferring a substrate loaded while fabricating a liquid crystal display device.

It is another object of the present invention to provide a transfer system that for preventing damage to a substrate by static electricity generated by a frictional force in the course of transferring a substrate.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a transfer system includes first and second shafts arranged in a constant ratio, non-conductive rollers affixed to each of the first shafts for transferring a substrate, and conductive rollers affixed to each of second shafts for transferring the substrate.

In another aspect, a transfer system includes first and second shafts arranged in such a manner as to have a first constant spacing on the same plane and are alternately arranged in a constant ratio, non-conductive rollers affixed to each of first shafts with a second constant spacing for transferring a substrate, and conductive rollers affixed to each of second shafts with the second constant spacing for transferring the substrate.

In a further aspect, a transfer device includes first and second shafts arranged in a constant ratio, non-conductive rollers affixed to each of the first shafts for transferring a substrate, and conductive rollers affixed to each of second shafts for transferring the substrate, wherein said second shafts are electrical conductive and connected to the conductive rollers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 4 is a plan view showing the transfer system according to a first embodiment of the present invention;

FIG. 5 is a plan view showing the transfer system according to a second embodiment of the present invention;

FIG. 6 is a plan view showing the transfer system according to a third embodiment of the present invention;

FIG. 7 is a plan view showing the transfer system according to a fourth embodiment of the present invention;

FIG. 8 is a plan view showing the transfer system according to a fifth embodiment of the present invention; and FIG. 9 is a plan view showing the transfer system according to a sixth embodiment of the present invention.

DETAILED DESCRIPTION OF THE EMBODIMENTS

Figure 1:
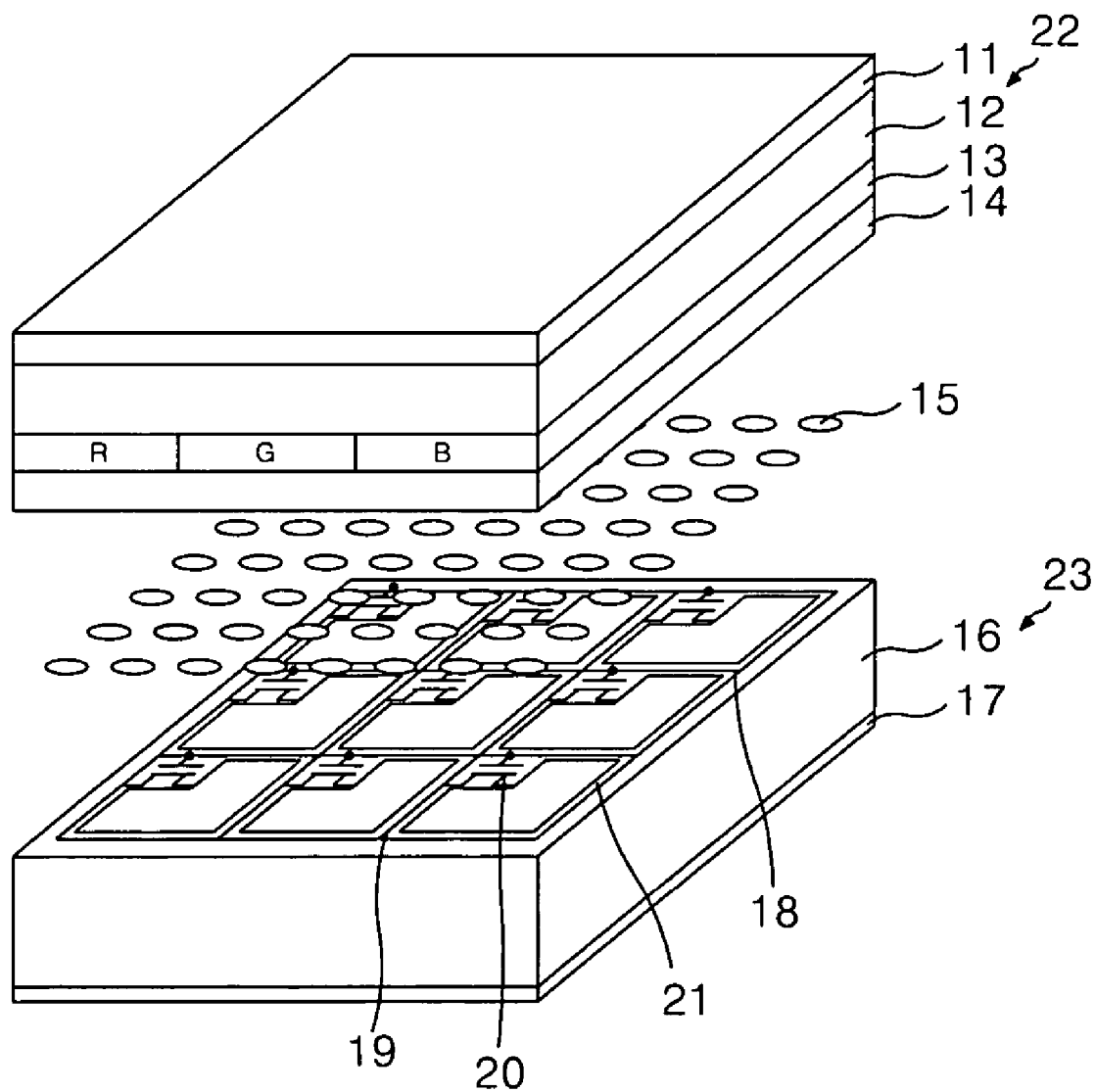
FIG. 1 is a perspective view showing a liquid crystal display device of an active matrix type according to the related art.
Figure 2:
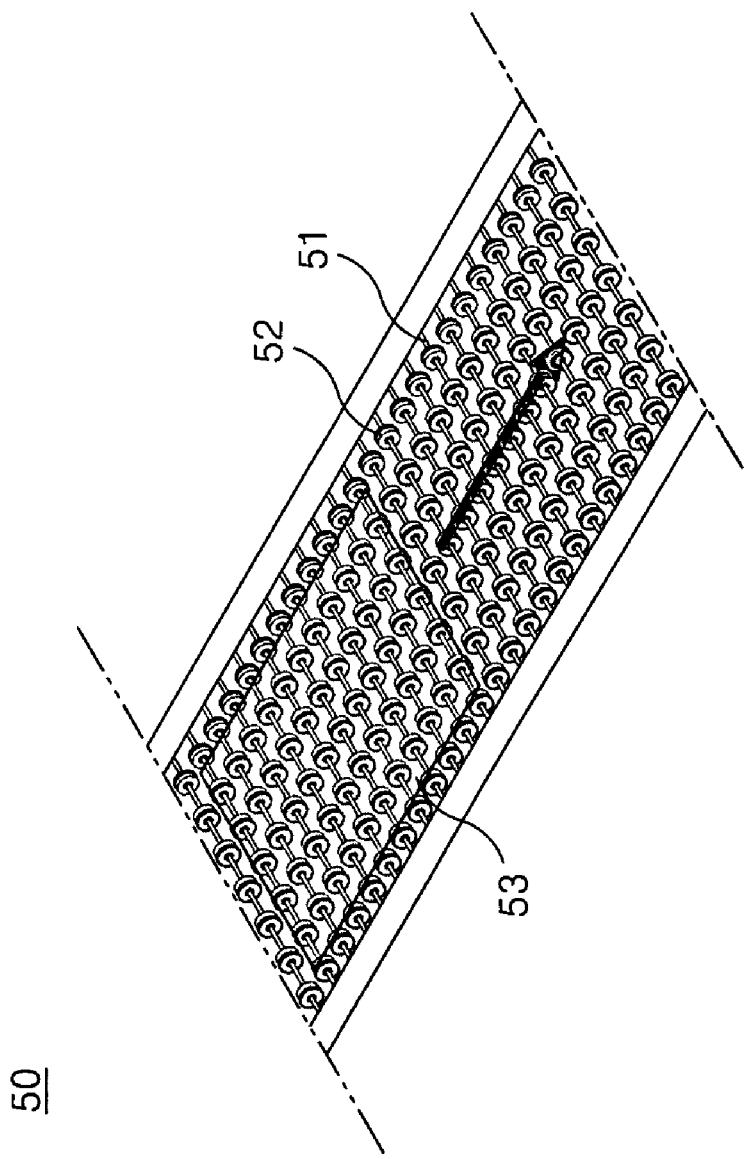
FIG. 2 is a perspective view showing a transfer system using a method of fabricating a related art liquid crystal display device.
Figure 3:
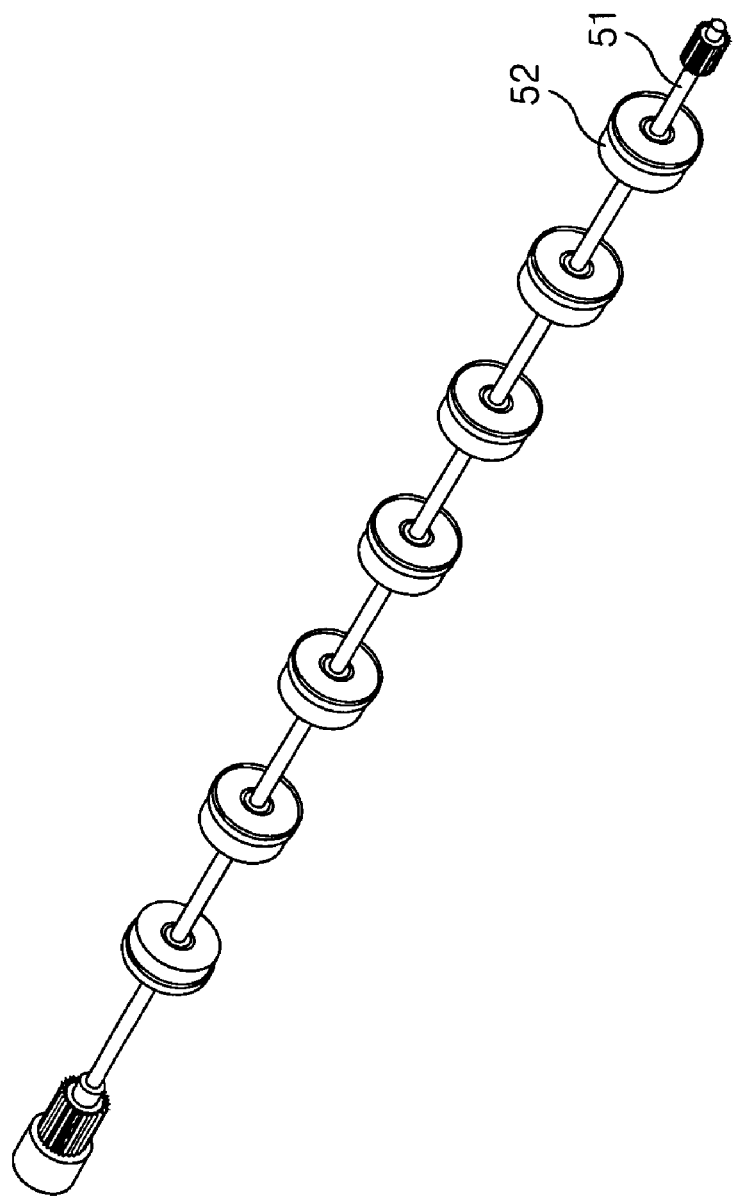
FIG. 3 is a perspective view showing rollers on a shaft in the transfer system of FIG. 2.

Hereinafter, the preferred embodiments of the present invention will be described in detail with reference to the accompanying drawings. The accompanying drawings show a transfer system having nine shafts in an exemplary embodiment of the present invention. Embodiments of the present invention are not confined to transfer system having nine shafts. In addition, the accompanying drawings show a transfer system having seven rollers on each shaft in an exemplary embodiment of the present invention. Embodiments of the present invention are not confined to transfer system in which each shaft has seven rollers. Embodiments of the present invention can have more or less than nine shafts with more or less than seven rollers.

FIG. 4 is a plan view of a transfer system according to a first embodiment of the present invention. Referring to FIG. 4, a transfer system 100 includes a plurality of shafts 110-1 to 110-9 arranged in such a manner as to have a constant spacing on the same plane, non-conductive rollers 120 attached on each of the odd shafts 110-1, 110-3, 110-5, 110-7 and 110-9 in such a manner as to have a constant spacing, and conductive rollers 130 attached on each of the even shafts 110-2, 110-4, 110-6 and 110-8 in such a manner as to have a constant spacing. The plurality of shafts 110-1 to 110-9 are formed of a metal material and are electrically conductive. The conductive rollers 130 on each of the even shafts 110-2, 110-4, 110-6 and 110-8 are electrically connected through the shaft on which the conductive rollers 130 are located.

In the first embodiment of the present invention, the odd shafts 110-1, 110-3, 110-5, 110-7 and 110-9 have non-conductive rollers 120 and the even shafts 110-2, 110-4, 110-6 and 110-8 have conductive rollers 130. Thus, the non-conductive rollers 120 and the conductive rollers 130 are alternately arranged. In other words, non-conductive rollers 120 are attached to the first shaft 110-1 in such a manner as to have constant spacing, conductive rollers 130 are attached to the second shaft 110-2 in such a manner as to have a constant spacing, non-conductive rollers 120 are attached to the third shaft 110-3 in such a manner as to have a constant spacing, conductive rollers 130 are attached to the fourth shaft 110-4 in such a manner as to have a constant spacing, non-conductive rollers 120 are attached to the fifth shaft 110-5 in such a manner as to have a constant spacing, conductive rollers 130 are attached to the sixth shaft 110-6 in such a manner as to have a constant spacing, non-conductive rollers 120 are attached to the seventh shaft 110-7 in such a manner as to have a constant spacing, conductive rollers 130 are attached to the eighth shaft 110-8 in such a manner as to have a constant spacing, and non-conductive rollers 120 are attached to the ninth shaft 110-9 in such a manner as to have a constant spacing.

The non-conductive rollers 120 can have better traction on the substrate 131 than the conductive rollers 130. However, the non-conductive rollers 120 create positive charges of static electricity by rubbing against the substrate 131 and the conductive rollers 130 create negative charges of static electricity by rubbing against the substrate 131. Accordingly, in the first embodiment of the present invention, the non-conductive rollers 120 and the conductive rollers 130 are alternately arranged so that the positive static electricity charged onto the substrate 131 from the non-conductive rollers 120 is offset by the negative static electricity charged onto the substrate 131 from the conductive rollers 130. The non-conductive rollers 120 can be rubber or polymer, while the conductive rollers 130 can be metal.

FIG. 5 is a plan view showing the transfer system according to a second embodiment of the present invention. Referring to FIG. 5, a transfer system 200 includes a plurality of shafts 210-1 to 210-9 arranged in such a manner as to have a constant spacing on the same plane, non-conductive rollers 220 attached on each of every third shaft of the plurality of shafts 210-1, 210-4 and 210-7 in such a manner as to have a constant spacing, and conductive rollers 230 attached in such a manner as to have a constant spacing on every pair of shafts of the plurality of shafts separated by a third shaft 210-2, 210-3, 210-5, 210-6, 210-8 and 210-9. The plurality of shafts 210-1 to 210-9 are formed of a metal material and are electrically conductive. The conductive rollers 230 on each of the on every pair of shafts of the plurality of shafts separated by a third shaft 210-2, 210-3, 210-5, 210-6, 210-8 and 210-9 are electrically connected through the shaft on which the conductive rollers 230 are attached.

In the second embodiment of the present invention, the third shafts 210-1, 210-4 and 210-7 have non-conductive rollers 220 on each of a pair of shafts separated by a third shaft of the plurality of shafts 210-2, 210-3, 210-5, 210-6, 210-8 and 210-9 have conductive rollers 230. In other words, non-conductive rollers 220 are attached to the first shaft 210-1 in such a manner as to have a constant spacing, conductive rollers 230 are attached to the second and third shafts 210-2 and 210-3 in such a manner as to have a constant spacing, non-conductive rollers 220 are attached to the fourth shaft 210-4 in such a manner to have a constant spacing, conductive rollers 230 are attached to the fifth and sixth shafts 210-5 and 210-6 in such a manner as to have a constant spacing, non-conductive rollers 220 are attached to the seventh shaft 210-7 in such a manner as to have a constant spacing, and the conductive rollers 230 are attached to the eighth and ninth shafts 210-8 and 210-9 in such a manner as to have a constant spacing.

The non-conductive rollers 220 can have better traction on the substrate 231 than the conductive rollers 230. However, the non-conductive rollers 220 create positive charges of static electricity by rubbing against the substrate 231 and the conductive rollers 230 create negative charges of static electricity by rubbing against the substrate 231. The non-conductive rollers 220 can create positive static electric charge more efficiently than the conductive rollers 230 can create negative static electric charge. For example, the amount of positive static electricity created by the seven non-conductive rollers 220 attached to the first shaft 210-1 is almost twice as much as the negative static electricity created by the seven conductive rollers 230 attached to the second shaft 210-2. Thus, negative static electricity from the seven conductive rollers 230 attached to the second shaft 210-2 offsets some of the positive static electricity form the seven non-conductive rollers 220 attached to the first shaft 210-1 and the rest of the positive static electricity is offset by negative static electricity from the seven conductive rollers 230 attached to the third shaft 210-3.

FIG. 6 is a plan view showing the transfer system according to a third embodiment of the present invention. Referring to FIG. 6, a transfer system 300 includes a plurality of shafts 310-1 to 310-9 arranged in such a manner as to have a constant spacing on the same plane, conductive rollers 320 are attached in such a manner as to have a constant spacing on each of a pair of shafts separated by a third shaft of the plurality of shafts 310-1, 310-2, 310-4, 310-5, 310-7 and 310-8, and non-conductive rollers 330 attached in such a manner as to have a constant spacing distance on each third shaft of the plurality of shafts 310-3, 310-6 and 310-9. The plurality of shafts 310-1 to 310-9 are formed of a metal material and have electrical conductivity. The conductive rollers 330 on every pair of shafts of the plurality of shafts separated by a third shaft 310-2, 310-3, 310-5, 310-6, 310-8 and 310-9 are electrically connected through the shaft on which the conductive rollers 330 are attached.

In the third embodiment of the present invention, each of a pair of shafts separated by a third shaft of the plurality of shafts 310-1, 310-2, 310-4, 310-5, 310-7 and 310-8 have conductive rollers 320 on each of the pair of shafts and the third shafts 310-3, 310-6 and 310-9 have non-conductive rollers 330. In other words, conductive rollers 320 are attached to the first and second shafts 310-1 and 310-2 in such a manner as to have a constant spacing, non-conductive rollers 330 are attached to the third shaft 310-3 in such a manner as to have a constant spacing, conductive rollers 320 are attached to the fourth and fifth shafts 310-4 and 310-5 in such a manner as to have a constant spacing, non-conductive rollers 330 are attached to the sixth shaft 310-6 in such a manner as to have a constant spacing, conductive rollers 320 are attached to the seventh and eighth shafts 310-7 and 310-8 in such a manner as to have a constant spacing, and non-conductive rollers 330 are attached to the ninth shaft 310-9 in such a manner as to have a constant spacing.

The positive static electricity created by the seven non-conductive rollers 330 attached to the third shaft 310-3 is offset by the negative static electricity created by seven conductive rollers 320 attached to the first shaft 310-1 and the seven conductive rollers 320 attached to the second shaft 310-2. Further, the positive static electricity created by the seven non-conductive rollers 330 attached to the third shaft 310-3 can also be offset by negative static electricity created by the seven conductive rollers 320 attached to the fourth shaft 310-4 and the seven conductive rollers 320 attached to the fifth shaft 310-5. In third embodiment of the present invention, the conductive rollers 320 and the non-conductive rollers 330 are arranged such that the negative electricity created by the conductive rollers 320 can be offset by the positive static electricity created by the non-conductive rollers 330.

FIG. 7 is a plan view showing the transfer system according to a fourth embodiment of the present invention. Referring to FIG. 7, a transfer system 400 includes a plurality of conductive shafts 410-1 to 410-9 arranged as shown in FIG. 7, conductive rollers 420 are attached in such a manner as to have a constant spacing on each of a pair of shafts separated by a third shaft of the plurality of shafts 410-1, 410-2, 410-4, 410-5, 410-7 and 410-8, and non-conductive rollers 430 are attached in such a manner as to have a constant spacing on each third shaft of the plurality of shafts 410-3, 410-6 and 410-9. The plurality of shafts 410-1 to 410-9 are formed of a metal material and have electrical conductivity. The conductive rollers 420 are electrically connected on each of a pair of shafts separated by a third shaft of the plurality of shafts 410-1, 410-2, 410-4, 410-5, 410-7 and 410-8 through the shaft on which the conductive rollers 420 are attached. In the fourth embodiment of the present invention, each of a pair of shafts separated by a third shaft of the plurality of shafts 410-1, 410-2, 410-4, 410-5, 410-7 and 410-8 having conductive rollers 420 are grounded to prevent negative static electricity on the substrate 431. Further, positive static electricity created by the non-conductive rollers 430 is removed by conductive rollers 420 on each pair of shafts separated by a third shaft of the plurality of shafts 410-1, 410-2, 410-4, 410-5, 410-7 and 410-8 that are connected to ground. Thus, static electricity generated in the course of transferring the substrate 431 is removed or prevented.

FIG. 8 is a plan view showing the transfer system according to a fifth embodiment of the present invention. Referring to FIG. 8, a transfer system 500 includes a plurality of conductive shafts 510-1 to 510-9 arranged as shown in FIG. 8, conductive rollers 520 are attached in such a manner as to have constant spacing on each of a pair of shafts separated by a third shaft of the plurality of shafts 510-1, 510-2, 510-4, 510-5, 510-7 and 510-8, and non-conductive rollers 530 are attached in such a manner as to have constant spacing on each third shaft of the plurality of shafts 510-3, 510-6 and 510-9, and an ionizer 510 arranged in such a manner to spray positive ions and negative ions on the transferring substrate 520. Accordingly, static electricity on a lower surface of the substrate 531 is controlled by the conductive rollers 531 and the non-conductive rollers 530, and static electricity on the upper surface of the substrate 531 is controlled by the positive ions and the negative ions sprayed from the ionizer 510 to neutralize static electricity. The ionizer 510 is arranged above both the pair of shafts separated by a third shaft of the plurality of shafts 510-1, 510-2, 510-4, 510-5, 510-7 and 510-8, and each third shaft of the plurality of shafts 510-3, 510-6 and 510-9. Thus, positive static electricity on the upper surface of the substrate 531 is offset by the negative ions sprayed from the ionizer 510, and negative static electricity on the upper surface of the substrate 531 is offset by positive ions sprayed from the ionizer 510.

FIG. 9 is a plan view showing the transfer system according to a sixth embodiment of the present invention. Referring to FIG. 9, a transfer system 600 includes a plurality of conductive shafts 610-1 to 610-9 arranged as shown in FIG. 9, conductive rollers 620 are attached in such a manner as to have constant spacing on each of a pair of shafts separated by a third shaft of the plurality of shafts 610-1, 610-2, 610-4, 610-5, 610-7 and 610-8, and non-conductive rollers 630 are attached in such a manner as to have constant spacing on each third shaft of the plurality of shafts 610-3, 610-6 and 610-9, an ionizer 610 arranged in such a manner to spray positive ions and negative ions onto the upper surface of a transferring substrate 631, and each of a pair of shafts separated by a third shaft of the plurality of shafts 610-1, 610-2, 610-4, 610-5, 610-7 and 610-8 are grounded. The conductive rollers 630 are electrically connected on each third shaft of the plurality of shafts 610-3, 610-6 and 610-9 through the shaft on which the conductive rollers 630 are attached. The ionizer 610 is arranged above both the pair of shafts separated by a third shaft of the plurality of shafts 610-1, 610-2, 610-4, 610-5, 610-7 and 610-8, and each third shaft of the plurality of shafts 610-3, 610-6 and 610-9.

Accordingly, positive static electricity created by the non-conductive rollers 630 on the bottom surface of substrate 631 is removed to ground, negative static electricity created by the conductive rollers 630 on the bottom surface of substrate 631 is prevented, positive static electricity on the upper surface of the substrate 631 is offset by the negative ions sprayed from the ionizer 610, negative static electricity on the upper surface of the substrate 631 is offset by positive ions sprayed from the ionizer 610.

In embodiments of the present invention, static electricity generated by a frictional force between a roller and a substrate is removed or prevented in the course of transferring the substrate. Accordingly, the components on the substrate are not damaged by static electricity. As a result, yield of a liquid crystal display device is improved.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A transfer system, comprising:
first and second shafts arranged in a constant ratio;
non-conductive rollers affixed to each of the first shafts for transferring a substrate; and
conductive rollers affixed to each of second shafts for transferring the substrate.

2. The transfer system as claimed in claim 1, wherein the constant ratio of the first shafts with the non-conductive rollers and the second shafts with the conductive rollers is one-to-one.

3. The transfer system as claimed in claim 2, further comprising:
an ionizer for spraying positive ions and negative ions, wherein the ionizer is arranged above both the first and second shafts.

4. The transfer system as claimed in claim 1, wherein the constant ratio of the first shafts with the non-conductive rollers and the second shafts with the conductive rollers is one-to-two.

5. The transfer system as claimed in claim 4, further comprising:
an ionizer for spraying positive ions and negative ions, wherein the ionizer is arranged above both the first and second shafts.

6. The transfer system as claimed in claim 4, wherein the second shafts are electrically conductive and connected to the conductive rollers.

7. The transfer system as claimed in claim 6, wherein the second shafts are connected to ground.

8. The transfer system as claimed in claim 6, further comprising:
an ionizer for spraying positive ions and negative ions, wherein the ionizer is arranged above both the first and second shafts.

9. The transfer system as claimed in claim 1, wherein the second shafts are electrically conductive and connected to the conductive rollers.

10. The transfer system as claimed in claim 9, wherein the second shafts are connected to ground.

11. A transfer system, comprising:
first and second shafts arranged in such a manner as to have a first constant spacing on the same plane and are alternately arranged in a constant ratio;
non-conductive rollers affixed to each of first shafts with a second constant spacing for transferring a substrate; and conductive rollers affixed to each of second shafts with the second constant spacing for transferring the substrate.

12. The transfer system as claimed in claim 11, wherein the constant ratio of the first shafts with the non-conductive rollers and the second shafts with the conductive rollers is one-to-one.

13. The transfer system as claimed in claim 12, further comprising:
    an ionizer for spraying positive ions and negative ions, wherein the ionizer is arranged above both the first and second shafts.

14. The transfer system as claimed in claim 11, wherein the constant ratio of the first shafts with the non-conductive rollers and the second shafts with the conductive rollers is one-to-two.

15. The transfer system as claimed in claim 14, further comprising:
    an ionizer for spraying positive ions and negative ions, wherein the ionizer is arranged above both the first and second shafts.

16. The transfer system as claimed in claim 14, wherein the second shafts are electrically conductive and connected to the conductive rollers.

17. The transfer system as claimed in claim 16, wherein the second shafts are connected to ground.

18. The transfer system as claimed in claim 16, further comprising:
    an ionizer for spraying positive ions and negative ions, wherein the ionizer is arranged above both the first and second shafts.

19. A transfer device, comprising:
    first and second shafts arranged in a constant ratio;
    non-conductive rollers affixed to each of the first shafts for transferring a substrate; and
    conductive rollers affixed to each of second shafts for transferring the substrate,
    wherein the second shafts are electrical conductive and connected to the conductive rollers.

20. The transfer device as claimed in claim 19, wherein the second shafts are connected to ground.

* * * * *